United States Patent [19]

Stocco

[11] Patent Number: 5,504,657
[45] Date of Patent: Apr. 2, 1996

[54] SYSTEM FOR PROVIDING AIR FLOW CONTROL AND EMR SHIELDING OF FRONT PANELS OF COMPUTERS AND SIMILAR ELECTRONIC EQUIPMENT

[75] Inventor: Frank C. Stocco, Wilmette, Ill.

[73] Assignee: AT&T Corp., Murray, N.J.

[21] Appl. No.: 266,058

[22] Filed: Jun. 27, 1994

[51] Int. Cl.⁶ ........................................................ H05K 7/14
[52] U.S. Cl. ........................ 361/800; 361/796; 361/816; 174/35 R; 455/300; 439/108; 220/402
[58] Field of Search ........................................ 361/800, 752, 361/796, 797, 818, 816; 174/359 C, 35 R, 35 MS; 220/402; 455/300; 439/108, 109

[56] References Cited

U.S. PATENT DOCUMENTS 3,375,408  3/1968  Buhrendorf et al. .
4,401,351  8/1983  Record .............................. 339/17 LM
5,204,496  4/1993  Boulay et al. ...................... 174/35 GC

*Primary Examiner*—Leo P. Picard
*Assistant Examiner*—Y. Whang
*Attorney, Agent, or Firm*—Michael B. Johannesen

[57] ABSTRACT

A face plate with an elastomeric, electrically-conductive gasket to provide electromagnetic radiation and control air flow for a front panel of an electronic equipment frame. The metallic face plate has a plurality of edge surfaces which are capable of providing electrically conductive contact with the frame wherein one of the edge surfaces has the gasket. The gasket is an electrically-conductive contact with the face plate and an adjacent face plate which forms a thermal seal and an electrically-conductive surface.

8 Claims, 4 Drawing Sheets

SYSTEM FOR PROVIDING AIR FLOW CONTROL AND EMR SHIELDING OF FRONT PANELS OF COMPUTERS AND SIMILAR ELECTRONIC EQUIPMENT

TECHNICAL FIELD

This invention relates to the field of shielding electronic equipment frames and, more specifically, to the area of EMR shielding and air flow control of front panels of such electronic equipment frames.

BACKGROUND OF THE INVENTION

Large electronic equipment generally comprises a plurality of circuit cards which make up the functional components of the equipment. Each of these circuit cards is plugged into a panel or backplane which provides the communication lines among the various circuit cards. In order to mechanically house and hold these cards in place, cabinets called "frames" have been used for many years.

FIG. 1 shows a typical frame for such circuit cards. Frame 100 has two metal sides 102, 104, and a metal top 106, floor 108, and back 110. The interior of this cabinet is subdivided into a plurality of shelves 112. Each shelf includes a number of plug-in card slots, which are then wired together on the backplane. Each shelf holds one or more circuit cards 114, depending upon the application. In the example of FIG. 1, there are power circuits 116 at the bottom of the frame and therefore very few circuits per shelf on the bottom. Alternatively, there are many circuit packs on the upper shelves.

Each circuit pack has a face plate 120, or stiffener, connected perpendicularly to the circuit pack on the end opposite the backplane. These face plates serve several functions. These face plates serve as stiffeners to hold the circuit cards in a vertical orientation and keep them from flexing. Further, they provide a handle or grasping means to facilitate maintenance personnel removing and inserting the circuit cards. These face plates may also be used as a support for labels, lights (i.e., system status, on/off, etc.) and other information (such as name or number of packs, etc.) regarding the state or condition of the circuit on the circuit card. It is currently standard in the art to provide gaps between the face plates on a particular shelf. These gaps allow easy insertion and removal of the circuit cards. Not having such gaps makes removal and insertion difficult, and greatly reduces tolerances for the backplane and the rack mounts of the circuit cards.

These gaps between the face plates, however, permit leakage of both electromagnetic radiation (EMR) and air. In order to meet standards for EMR radiation from the front of a frame, prior art frames are equipped with a door 121. The circuit cards require thermal control which is normally provided by continuous air flow, and door 121 promotes air circulation by sealing the front of the frame. It is common to use large fans 122 at the bottom of a frame in order to circulate air up through the frame to an outlet 123 on top and thus cool it. For clarity, only a single fan is shown, but commonly a number are used. If air leaks through the front panel, as illustrated by the arrows 124, such cooling efficiency is greatly reduced. As well as adding cost and taking up valuable space, door 121 impedes access to circuit packs, because door 121 must be closed to maintain EMR and thermal operating standards.

An objective is, therefore, to provide electromagnetic radiation shielding and air flow containment for thermal control without having to resort to a door.

SUMMARY OF THE INVENTION

This problem is solved and a technical advance is achieved in the art by a new configuration of circuit card face plates with an elastomeric, electrically-conductive gasket that provides electromagnetic radiation and air flow control for a front panel of an electronic equipment frame. The metallic face plate has a plurality of edge surfaces which are capable of providing an electrically conductive contact with the frame when inserted, wherein one of the edged surfaces holds the gasket. The gasket is in electrically-conductive contact with the face plate and an adjacent face plate, thus, with all cards in place, an air flow barrier and an electrically-conductive surface is established. In this manner, the entire face plate is electrically conductive and connected to the frame, forming a ground plane which provides a shield for electromagnetic radiation. Furthermore, the elastomeric gasket provides a seal against significant air leakage from between adjacent face plates. This air seal enhances thermal control and is referred to herein as a "thermal seal."

BRIEF DESCRIPTION OF THE DRAWINGS

A more complete understanding of the invention may be obtained from a consideration of the following description in conjunction with the drawings, in which.

DETAILED DESCRIPTION

Figure 1:
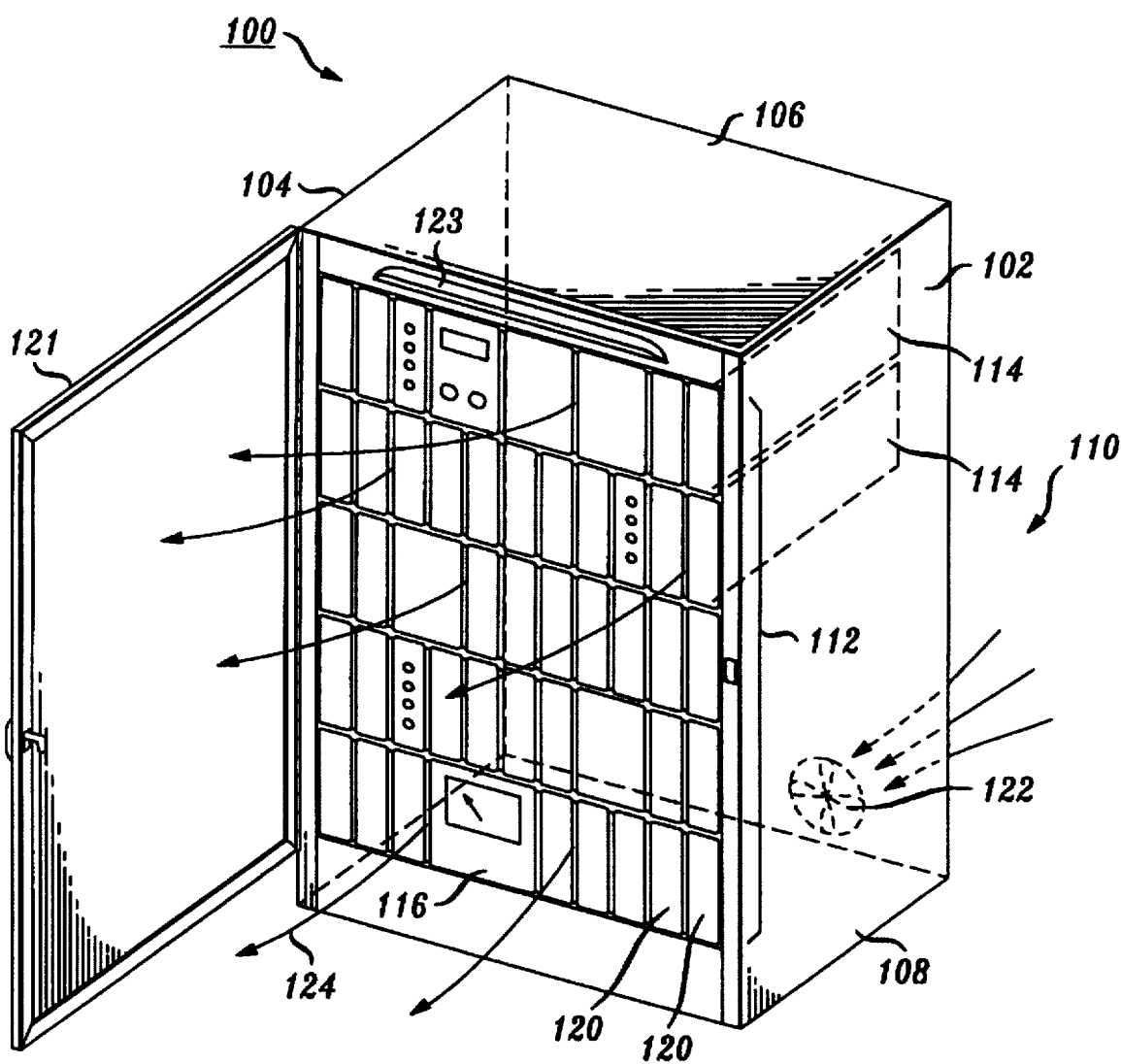
FIG. 1 is an illustration of a prior art circuit card frame or cabinet.
Figure 2:
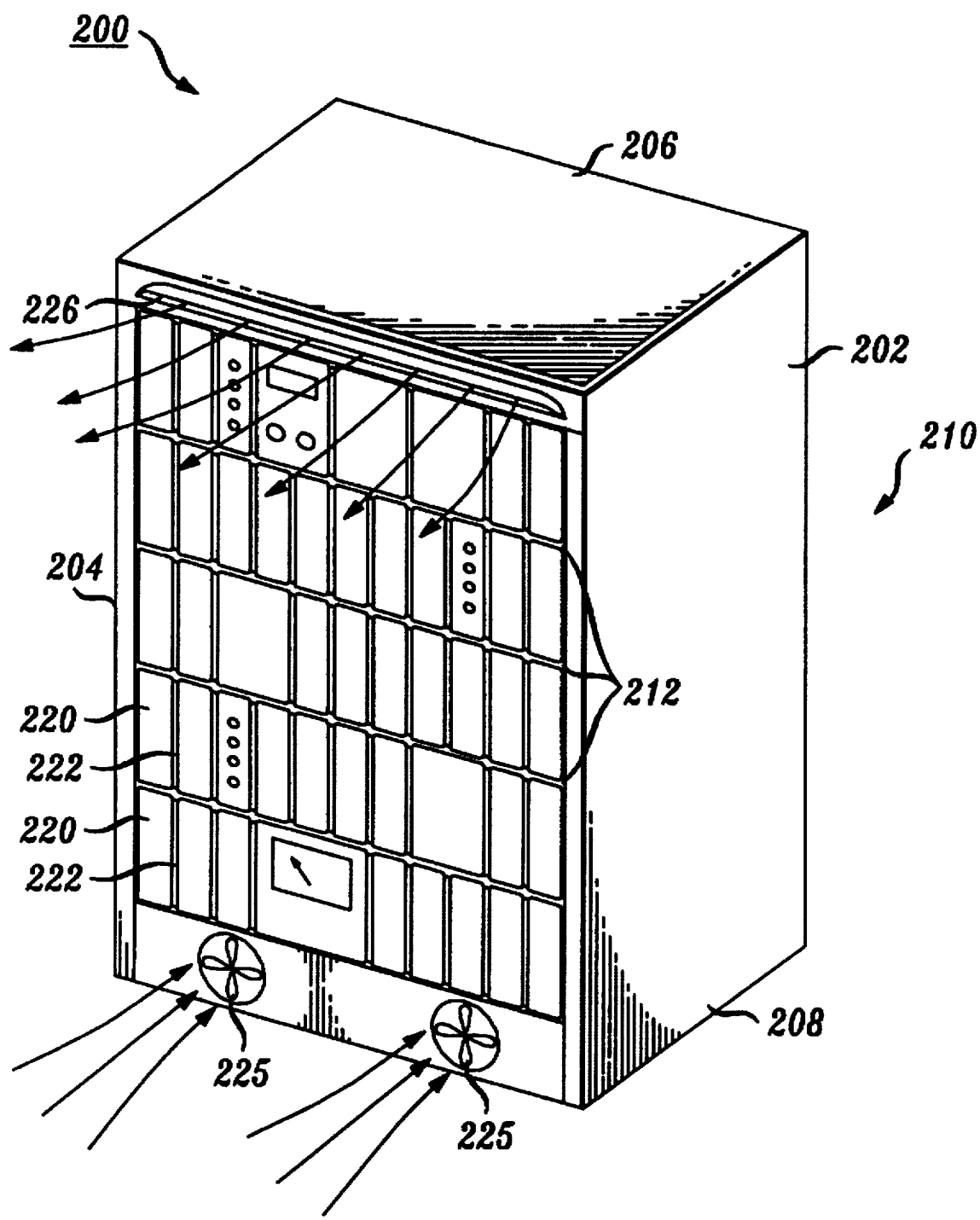
FIG. 2 is an illustration of a frame which employs an exemplary embodiment of this invention.

FIG. 2 shows an electronic equipment frame 200 in which an exemplary embodiment of this invention. As in the prior art, it comprises two metal sides 202, 204, and a metal top 206, bottom 208 and backplane 210. Circuit cards are arranged on a plurality of shelves 212. As opposed to the teaching of the prior art, however, there is no need for a door. There is, instead, a plurality of face plates 220 with electrically conductive, elastomeric gaskets 222 between them in order to provide EMR shielding and air flow control. According to an exemplary embodiment of this invention, each front panel 220 is designed to fit precisely into frame 200 between shelves 212 so that there is a fairly close tolerance between front panels. The gap between front panels is, as will be described in more detail below, filled with a gasket 222 comprising a conductive, elastomeric material. As a result, the front of each shelf 212 is conductive (i.e., 0 resistance) from one end to the other. Such conductivity provides an effective shield for electromagnetic radiation (EMR) thus providing a system capable of meeting EMR standards without having to resort to a door. Furthermore, frame 200 is effectively air sealed so that air intake through fans 225 is then conducted up through the cards and out exhaust port 226 providing more efficient and thus a calculable level of cooling through frame 200.

Figure 3:
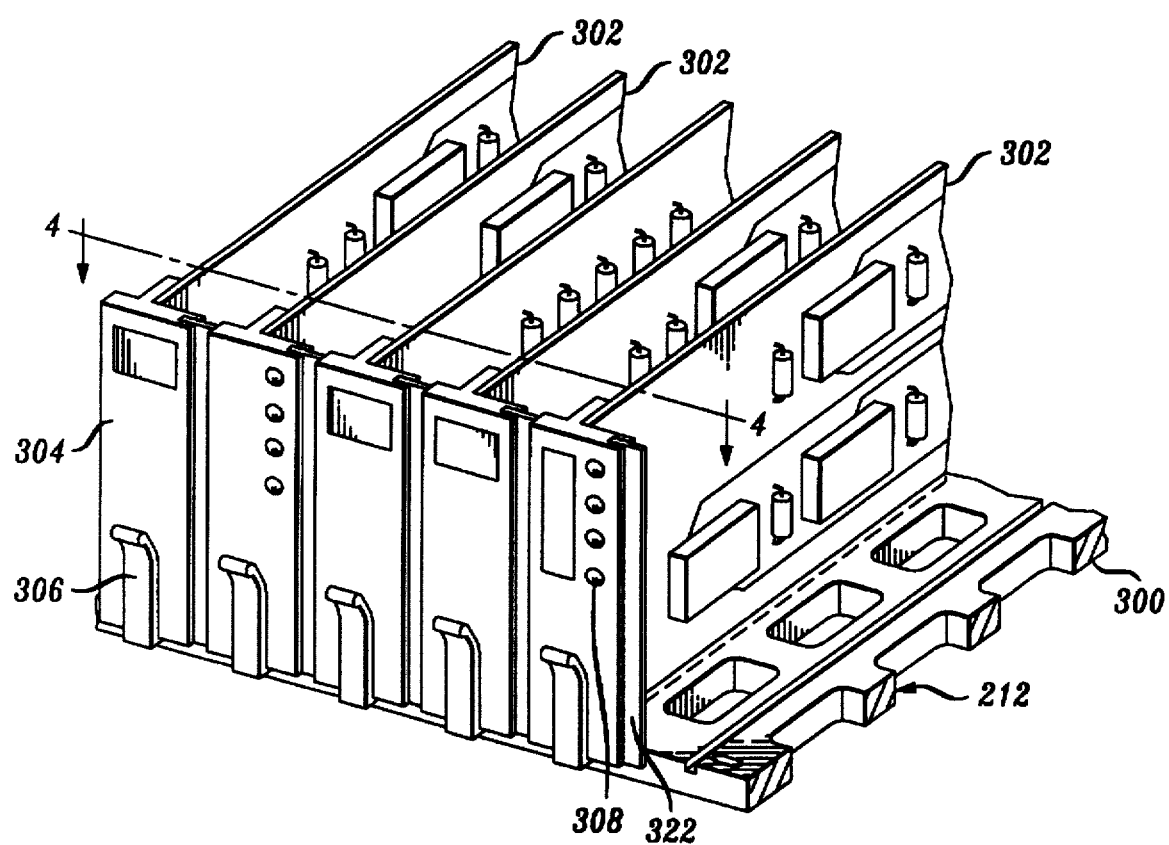
FIG. 3 is an illustration of a shelf of the frame of FIG. 2 employing an exemplary embodiment of this invention.

Turning now to FIG. 3, one shelf 212 of frame 200 is shown in detail. Each shelf comprises a rack 300 made of metal, as is known in the art. The rack is slotted to receive a lower edge of each circuit card. The rack also has openings or holes to facilitate air circulation. Each shelf holds a plurality of circuit cards 302 containing the components that provide system functionality. Attached to each circuit card is a face plate 304, or stiffener, to provide a brace for the circuit card and to hold the circuit card into the frame. Each face plate may include a clip 306 in order to hold the circuit card securely into the frame and may also include lights 308 or other indications which provide maintenance personnel with an indication of the functioning of the circuit card.

Each face plate is made of a conductive metal in dimensions so that it conductively touches the rack on the top and bottom. Also, each face plate that mounts on the end of the shelf is sized to contact the sides, thus forming an electrically conductive surface.

According to this invention, a conductive, elastomeric gasket 322 is between each adjacent face plate. Gasket 322 forms an air flow seal so that there is no air loss between face plates and is also in contact with the two adjacent face plates thus providing electrical conductivity from one face plate to the next. Such gaskets are available from Chomerics of Woburn, Mass., 01888.

Figure 4:
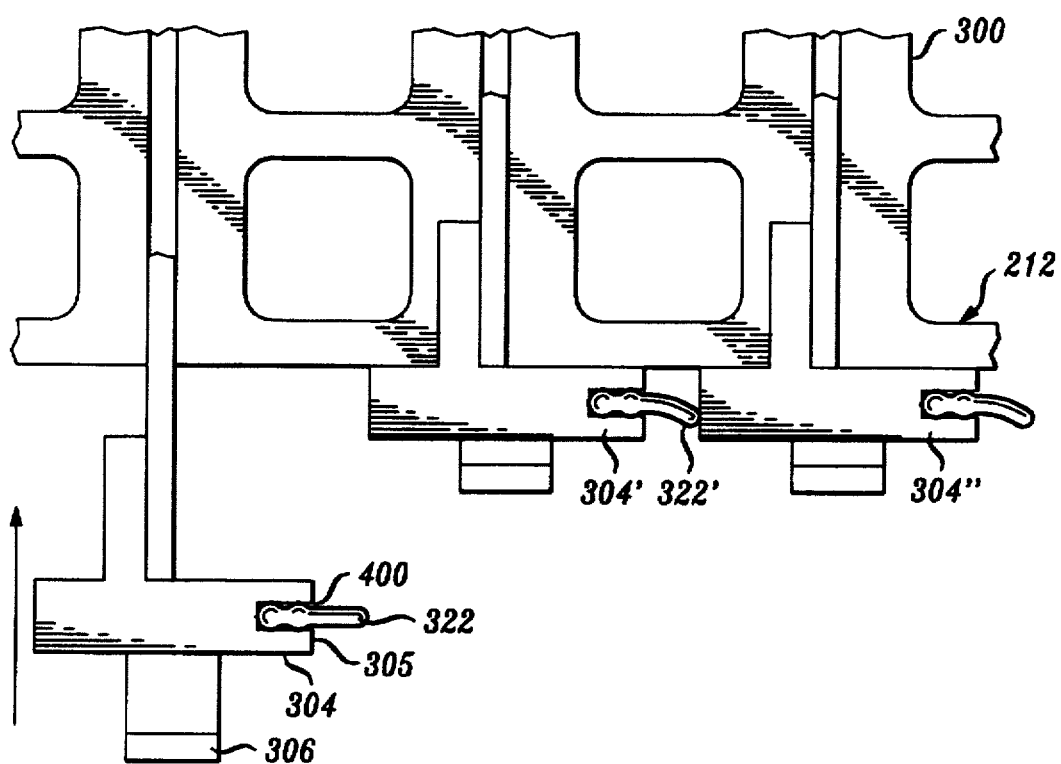
FIG. 4 is a top view of FIG. 3 illustrating interactions of an exemplary embodiment of this invention.

FIG. 4 illustrates a top view of the shelf of FIG. 3 with one face plate 304 and card pulled forward to illustrate an exemplary embodiment of this invention. Face plate 304, as stated above, comprises a conductive metal which has bare, unfinished surfaces at the edges in order to provide conductivity. According to the exemplary embodiment of this invention, a gasket 322 comprising a conductive elastomeric material is mounted in a slot 400 or groove in one vertical edge 305 of face plate 304. Elastomeric gasket 322 extends laterally from face plate and is long enough and flexible enough to make a sealing contact with the next adjacent face plate 304.

Gasket 322 is formed in such a manner as to have a friction fit in slot 400 of face plate 304. As the circuit card is pushed in (or the next adjacent circuit card is pushed in) gasket 322 comes in contact with the side of the next adjacent circuit card and flexes. The space between the circuit cards is thus filled up providing an air seal. When the conductive elastomeric material comes in contact with the next adjacent circuit card, it also provides an electrical connection providing EMR shielding. When the cards are inserted, their face plates, such as 304' and 304" are joined by the gaskets, such as 322'affixed to face plate 304'.

Figure 5:
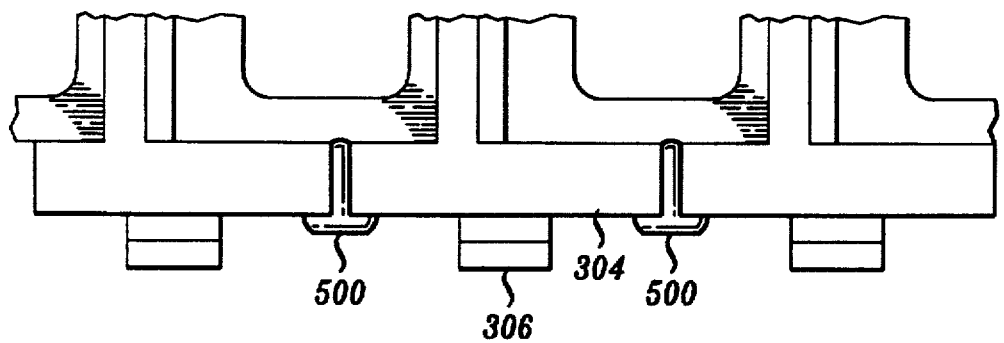
FIG. 5 is a top view of an alternate embodiment of this invention.
Figure 6:
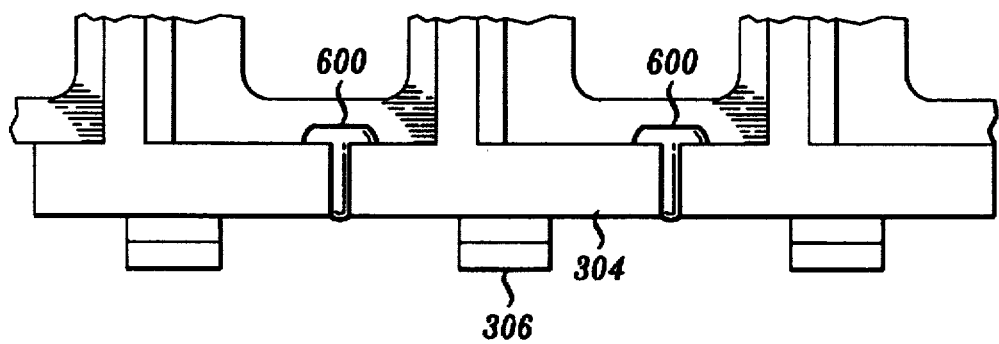
FIG. 6 is a top view of a further alternate embodiment of this invention.

The gasket does not necessarily have to reside in a groove in the face plate, however, there are many advantages to such an arrangement. A gasket 500 could also be applied after all face plates have been inserted into the shelf as in FIG. 5, or may be applied to the back of the face plates so that the gaskets 600 are in contact when the face plates are all mounted in the rack as in FIG. 6. Alternatively, the gasket may be mounted on, or applied to the face plate with a suitable, electrically conductive adhesive.

It is to be understood that the above-described embodiments are merely illustrative principles of the invention, and that many variations may be devised by those skilled in the art without departing from the scope of this invention. It is, therefore, intended that such variations be included within the scope of the claims.

I claim:

1. A face plate apparatus for providing electromagnetic radiation shielding for a front surface of an electronic equipment frame, said apparatus comprising:

a metallic face plate and gasket;

said metallic face plate having a plurality of edge surfaces being capable of providing electrically conductive contact with said gasket, at least one of said plurality of edge surfaces having said gasket;

said gasket being an electrically conductive, elastomeric material positioned so that said gasket forms an electrically conductive seal between said face plate and an adjacent face plate; and said gasket also providing a seal to air flow when said face plate is positioned in said frame.

2. A face plate apparatus for providing electromagnetic radiation shielding for a front surface of an electronic equipment frame, said apparatus comprising:

a metallic face plate and gasket;

said metallic face plate having a plurality of edge surfaces being capable of providing electrically conductive contact with said gasket, at least one of said plurality of edge surfaces having said gasket;

said gasket being an electrically conductive, elastomeric material positioned so that said gasket forms an electrically conductive seal between said face plate and an adjacent face plate; and said gasket attaches to said face plate by an electrically conductive adhesive.

3. A face plate apparatus for providing electromagnetic radiation shielding for a front surface of an electronic equipment frame, said apparatus comprising:

a metallic face plate and gasket;

said metallic face plate having a plurality of edge surfaces being capable of providing electrically conductive contact with said gasket, at least one of said plurality of edge surfaces having said gasket;

said gasket being art electrically conductive, elastomeric material positioned so that said gasket forms an electrically conductive seal between said face plate and art adjacent face plate; and said gasket is applied to the front of at least one face plate to provide said electrically conductive seal with an adjacent one of said face plates.

4. An apparatus for providing electromagnetic shielding in an electronic equipment frame having a plurality of electrical circuit cards, said apparatus comprising:

a plurality of face plates, each of said plurality of face plates being attached to one of said plurality of circuit cards;

each of said plurality of face plates being electrically connected to an adjacent one of said plurality of face plates by a conductive, elastomeric gasket, so that all adjacent face plates collectively provide an electromagnetic radiation shield for said plurality of circuit cards; and said circuit cards are secured in a frame, wherein ones of said face plates contact said frame, so that said plurality of gaskets and said plurality of face plates form an electromagnetic radiation shield over a front portion of said frame.

5. An apparatus according to claim 4, wherein said frame includes walls, top, bottom and back made of an electromagnetic shielding material, so that said frame, said face plates and said gaskets form an electromagnetic radiation shield around said circuit cards.

6. A face plate apparatus for providing a thermal seal for a front portion of an electronic equipment frame, said apparatus comprising:

a face plate and gasket;

said face plate having a plurality of edge surfaces, one of said plurality of edge surfaces having said gasket affixed thereto;

said gasket being an elastomeric material so that said gasket forms an air seal between said face plate and an adjacent face plate; and said gasket is affixed to the back of two adjacent face plates to provide said thermal seal.

7. A face plate apparatus for providing a thermal seal for a front portion of an electronic equipment frame, said apparatus comprising:

a face plate and gasket;

said face plate having a plurality of edge surfaces, one of said plurality of edge surfaces having said gasket affixed thereto;

said gasket being an elastomeric material so that said gasket forms an air seal between said face plate and an adjacent face plate; and said gasket is affixed to the front of two adjacent face plates to provide said thermal seal.

8. An apparatus for providing a thermal seal in a frame including a plurality of electrical circuit cards, said apparatus comprising:

a plurality of face plates, each of said plurality of face plates being attached to one of said plurality of circuit cards;

each of said plurality of face plates being sealed to an adjacent one of said plurality of face plates by an elastomeric gasket, so that all adjacent face plates provide a thermal seal for said plurality of circuit cards; and said frame includes walls, top, bottom and back made of a thermal sealing material, so that said frame, said face plates and said gaskets form a thermal seal around said circuit cards.

* * * * *

UNITED STATES PATENT AND TRADEMARK OFFICE
CERTIFICATE OF CORRECTION

PATENT NO. : 5,504,657
DATED : April 2, 1996
INVENTOR(S) : Frank C. Stocco, et al It is certified that error appears in the above-indentified patent and that said Letters Patent is hereby corrected as shown below:

On title page, item [19], should read --Stocco, et al--
On title page, item [75], should read as follows:
--Frank C. Stocco , Wilmette, Richard A. Bellino, Carol Stream, Ill.
William J. Harvey, Hoboken, NJ, Paul E. Maass, Naperville, Ill.--

Signed and Sealed this

Tenth Day of December, 1996

Attest:

BRUCE LEHMAN

*Attesting Officer*     *Commissioner of Patents and Trademarks*